US006416331B1

United States Patent
Shimizu

(10) Patent No.: US 6,416,331 B1
(45) Date of Patent: Jul. 9, 2002

(54) IC SOCKET AND SEMICONDUCTOR DEVICE WITH REPLACEABLE LEAD MEMBERS

(75) Inventor: Tadayuki Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/644,831

(22) Filed: Aug. 24, 2000

(30) Foreign Application Priority Data

Mar. 28, 2000 (JP) ........................................ 2000-088339

(51) Int. Cl.$^7$ .............................................. H01R 12/00
(52) U.S. Cl. ........................... 439/66; 439/91; 439/701; 439/937
(58) Field of Search ........................... 439/66, 701, 91, 439/937

(56) References Cited

FOREIGN PATENT DOCUMENTS

| JP | 7-335353 | 12/1995 |
|---|---|---|
| JP | 10-125426 | 5/1998 |

*Primary Examiner*—Tho D. Ta
*Assistant Examiner*—Truc Nguyen
(74) *Attorney, Agent, or Firm*—McDermott, Will & Emery

(57) ABSTRACT

An IC socket that can improve the efficiency of the lead replacement process and a semiconductor device having such an IC socket are provided. The IC socket is removably mounted on a circuit substrate, and includes a plurality of linear lead members, a lead module, and a socket base body. The lead module is replaceable and holds lead members of each group of a plurality of groups into which the plurality of lead members are divided. The lead module is provided in plurality to hold each of the plurality of groups. The socket base body is placed between the circuit substrate and the lead module and determines the position of the lead module on the circuit substrate.

10 Claims, 11 Drawing Sheets

IC SOCKET AND SEMICONDUCTOR DEVICE WITH REPLACEABLE LEAD MEMBERS

BACKGROUND OF THE INVENTION

1. Field of the Invention

The present invention relates to an IC socket and a semiconductor device, and more specifically, to an IC socket and a semiconductor device provided with a plurality of lead members.

2. Description of the Background Art

Conventionally, an IC (Integrated Circuit) socket for supporting an IC device or the like such that the IC device is removably connected to a circuit formed on a circuit substrate and for electrically connecting the circuit on the circuit substrate with an electrode of the IC device via a lead member incorporated within and a semiconductor device provided with such IC socket are known. The conventional IC socket will be described with reference to FIGS. 11 and 12. FIG. 11 is a schematic plan view showing the conventional IC socket, while FIG. 12 is a schematic diagram representing a semiconductor device formed with the IC socket shown in FIG. 11 disposed on the circuit substrate. FIG. 12 schematically represents a cross section of an IC socket 101 taken along the line XII—XII in FIG. 11.

As shown in FIGS. 11 and 12, IC socket 101 for electrically connecting the circuit formed on a circuit substrate 107 to an IC device 104 is disposed on circuit substrate 107 which has the circuit formed thereon. IC device 104 is mounted on IC socket 101. A socket cover 103 for pressing and fixing IC device 104 against IC socket 101 is provided on IC device 104. A plurality of electrodes 131 are disposed in a matrix on the bottom wall of IC device 104. An electrode 131 is a hemispheric solder ball arranged on the bottom wall of IC device 104.

IC socket 101 is formed by a socket base body 117, a socket intermediate member 150, a socket cover body 120, and leads 106. As shown in FIG. 11, in IC socket 101, leads 106 are disposed in a matrix in positions corresponding to the plurality of electrodes 131 of IC device 104.

As shown in FIG. 13, lead 106 has a linear shape and includes a lead cylindrical body 151, an upper terminal 108, a lower terminal 130, and a spring 152. FIG. 13 is a schematic diagram illustrating the structure of lead 106. Lead cylindrical body 151 has a hollow cylindrical shape, and has an opening formed in the upper surface and an opening formed in the bottom surface. Upper terminal 108, lower terminal 130, and spring 152 are accommodated within lead cylindrical body 151. A portion of upper terminal 108 projects from the opening in the upper surface of lead cylindrical body 151, and a portion of lower terminal 130 projects from the opening in the bottom surface of lead cylindrical body 151. The diameters of the respective portions of upper terminal 108 and lower terminal 130 located inside lead cylindrical body 151 are larger than the diameters of the openings formed in the upper surface and the bottom surface of lead cylindrical body 151. As a result, upper terminal 108 and lower terminal 130 are never pushed out of lead cylindrical body 151. Spring 152 is disposed between upper terminal 108 and lower terminal 130. Thus, as shown in FIG. 12, when IC device 104 is pressed against the upper surface of IC socket 101, thereby pressing an electrode 131 against upper terminal 108 of lead 106, the reliable contact between upper terminal 108 and electrode 131 can be ensured by the elasticity of spring 152. Similarly, when IC socket 101 is pressed against circuit substrate 107, the elasticity of spring 152 ensures the reliable contact between lower terminal 130 and an electrode on circuit substrate 107.

Moreover, a sleeve-like lead protrusion 132 is formed surrounding the sidewall of lead cylindrical body 151 in the central portion of the sidewall of lead cylindrical body 151 of lead 106. In addition, as shown in FIG. 14, openings 115 and 109 which have substantially the same diameter as lead cylindrical body 151 and into which lead cylindrical body 151 can be inserted are respectively formed in socket base body 117 and socket cover body 120 of IC socket 101. An opening 110 is formed in the upper surface of socket cover body 120, and an opening 116 is formed in the lower surface of socket base body 117. FIG. 14 is a schematic perspective view of the IC socket shown in FIG. 11. Further, an opening 153 which has substantially the same diameter as lead protrusion 132 and into which lead protrusion 132 can be inserted is formed in socket intermediate member 150 of IC socket 101.

After inserting the lower portion of lead 106 into opening 115 of socket base body 117, socket intermediate member 150 and socket cover body 120 are stacked and fixed onto socket base body 117 such that lead 106 is inserted into their respective openings 153 and 109. Thus, as shown in FIG. 14, the diameters of openings 115 and 109 of socket base body 117 and socket cover body 120 are smaller than the diameter of lead protrusion 132 so that lead 106 can be fixed. IC socket 101 is thus formed.

In such IC socket 101, the elasticity of spring 152 of lead 106 can weaken as a result of deformation during use over time. As a consequence, contact failure may result between upper terminal 108 and electrode 131, or between lower terminal 130 and an electrode on circuit substrate 107. Conventionally in such a case, as shown in FIG. 15, socket cover body 120 is removed from IC socket 101, and lead 106 that has a defect is individually and manually replaced. FIG. 15 is a schematic perspective view related to the description of the lead replacement in the IC socket shown in FIG. 11.

In recent years, as IC device 104 is further miniaturized, the spacing between electrodes 131 of IC device 104 and the size of electrode 131 itself are accordingly becoming smaller. Lead 106 in IC socket 101 is also miniaturized, and the spacing of leads 106 in IC socket 101 is also made smaller. As a result, it is increasingly difficult to replace lead 106 as that shown in FIG. 15 manually with accuracy and speed. Furthermore, it is expected that the above-described problem will become more serious as IC device 104 is miniaturized even further.

Conventionally, to solve the above-described problem, an IC socket provided with a module holding a plurality of leads is disclosed, for instance, in Japanese Patent Laying-Open No. 10-125426. Moreover, Japanese Patent Laying-Open No. 7-335353 discloses an IC socket similar to the IC socket disclosed in the above Japanese Patent Laying-Open No. 10-125426. The IC sockets disclosed in the above Japanese Patent Laying-Open Nos. 10-125426 and 7-335353 can be repaired easily when a defect is found in a lead, by replacing a module that holds the defective lead.

The IC socket disclosed in the above Japanese Patent Laying-Open No. 10-125426, however, employs a lead with a curved portion. Thus, the technique disclosed in the above Japanese Patent Laying-Open No. 10-125426 is considered to be a totally different technique from that of the present invention related to an IC socket using a linear lead. Moreover, with the lead having a curved portion, the curved portion of another lead adjacent to the lead to be replaced in a module obstructs the lead to be replaced, making the replacement difficult. Such a problem does not occur, however, when a linear lead is employed as in the present invention.

The IC socket in Japanese Patent Laying-Open No. 7-335353, discloses contact blocks as modules including a plurality of leads. A contact pin serving as a lead accommodated in the contact block is a pin also having a curved portion like the IC socket disclosed in the above Japanese Patent Laying-Open No. 10-125426. For the same reason, this technique disclosed in Japanese Patent Laying-Open No. 7-335353 is considered to be a totally different technique from that of the present invention related to the IC socket using a linear lead. Furthermore, upon review by the inventor of the IC socket disclosed in the above Japanese Patent Laying-Open No. 7-335353, contact blocks serving as a module is inserted from underneath (from the circuit substrate side) into block grooves which are through-openings formed in a block housing (in other words, contact blocks are disposed directly on the circuit substrate, and no member resides between the circuit substrate and the contact blocks). Consequently, upon replacing a contact block, when the block housing is lifted upward from the circuit substrate, not only the contact block to be replaced but also other normal contact blocks tend to fall off from the block housing. Thus, a further improvement seems necessary from the viewpoint of efficiency of the replacement process of the contact blocks. As seen from the above, the above IC sockets are based on totally different techniques from that of the present invention, and are not satisfactory as far as the improvement in the efficiency of the IC socket repair process (replacement of a defective lead) is concerned.

SUMMARY OF THE INVENTION

An object of the present invention is to provide an IC socket that can improve the efficiency of the lead replacement process and a semiconductor device provided with such an IC socket.

According to one aspect of the present invention, the IC socket is removably mounted on a circuit substrate and is provided with a plurality of linear lead members, a lead module, and a socket base body. The plurality of lead members are divided into a plurality of groups, and the lead module is a replaceable lead module that holds each group of lead members and is provided in plurality to hold each of the plurality of groups. The socket base body is placed between the circuit substrate and the lead module and determines the position of the lead module against the circuit substrate.

Thus configured, a lead member having a defect can be replaced with a normal lead member by replacing the lead module that includes the lead member with the defect when such a defect is found in the lead member. In other words, the IC socket can be repaired with ease. Thus, high efficiency in the process of replacing the defective lead member with a normal lead member to repair the IC socket can be maintained even when the IC device is miniaturized, and the size of a lead member and the spacing between the lead members become smaller.

In addition, since a linear lead member is employed instead of a lead member having a curved portion, the process of removing/mounting the lead member from/to the lead module can be easily performed when a lead module having removably mounted lead members is used.

Moreover, since the lead module is disposed on the socket base body positioned on the circuit substrate, the replacement of the lead module including the lead member having a defect can be performed with the socket base body placed on the circuit substrate. Consequently, the positional relationship between the circuit substrate and the lead members included in the lead module other than the lead module that includes the lead member with a defect does not disadvantageously vary as a result of the replacement.

In the IC socket according to the above aspect, the plurality of lead members may be disposed in a straight line in the lead module.

In the IC socket according to the above aspect, the plurality of lead members may be disposed in a matrix in the lead module.

In this case, since the lead members are disposed in a matrix, a larger lead module can be obtained in which a plurality of lead modules, each having lead members disposed in a straight line, are grouped together. As a consequence, the size of the lead module can be kept large enough such that the efficiency of the replacement process does not decline when the lead members are further miniaturized. As a result, high efficiency of the replacement process of the lead module is maintained.

The IC socket according to the above aspect preferably is provided with a guide member for positioning a lead module against the socket base body.

In this case, the positioning of the lead module against the socket base body can be performed easily with the guide member so that the efficiency of the replacement process of the lead module can be improved.

In the IC socket according to the above aspect, the guide member preferably includes a guiding protrusion formed on a surface facing the socket base body of the lead module and a guiding dent formed on a surface facing the lead module of the socket base body for inserting the protrusion therein. The guiding dent preferably is formed in the socket base body in a region below the region in which the guiding protrusion of the lead module resides when the lead module is disposed on the socket base body.

In this case, the lead module can be easily positioned against the socket base body by inserting the guiding protrusion of the lead module into the guiding dent of the socket base body.

In addition, the guiding protrusion and the guiding dent can be utilized as fixing members for fixing the lead module to the socket base body so that the strength with which the lead module is fixed to the socket base body is improved.

In the IC socket according to the above aspect, the socket base body has a sidewall, and the lead module preferably includes a protrusion formed such that it projects outward from the sidewall of the socket base body.

In this case, the operator may hold the protrusion to remove the lead module from the socket base body with ease during the replacement of the lead module. Thus, the efficiency of the replacement process of the lead module can be improved further.

In the IC socket according to the above aspect, the lead module preferably includes a module base body and a module cover body. The module base body preferably holds a lead member as well as determines the position of the lead member in the lead module, while the module cover body preferably is disposed on the module base body and fixes the lead member.

Thus configured, a lead module can be provided in which a lead member is fixed to a precise position by a module base body and a module cover body.

Moreover, when the module base body and the module cover body are removably fixed by a module cover fixing member such as a screw, it becomes possible to remove only the lead member having a defect from the lead module to replace it with a new lead member. As a result, the lead module may be reused. Further, the lead member having the defect alone can be replaced as in the conventional example by removing the module cover body while the lead module remains disposed on the socket base body.

The IC socket according to the above aspect is preferably provided with a socket cover body that makes contact with the lead module.

In this case, since the socket cover body is disposed contacting the lead module, the lead module can be fixed in position by the socket cover body.

In the IC socket according to the above aspect, the socket cover body has an upper surface and a lower surface, and further, an upper through-hole which passes through the socket cover body from the upper surface to the lower surface and into which a portion of the lead member is inserted may be formed in the socket cover body. The socket base body has an upper surface and a lower surface, and further, a through-hole which passes through the socket base body from the upper surface to the lower surface and into which another portion of the lead member is inserted may be formed in the socket base body. The module cover body is preferably provided with a hole which is located underneath the upper through-hole of the socket cover body and into which the lead member is inserted. The lead member may include a lower terminal portion that projects from the lower surface of the socket base body via the through-hole of the socket base body and an upper terminal portion that projects from the upper surface of the socket cover body via the upper through-hole of the socket cover body.

Thus configured, the present invention can be applied to the IC socket that utilizes the lower terminal portion as an electrode to be connected to an electrode of a circuit formed on the circuit substrate and that utilizes the upper terminal portion as an electrode to be connected to an electrode of a semiconductor device such as an IC device mounted on the IC socket.

The IC socket according to the above aspect may respectively connect a plurality of electrode terminals on the circuit substrate to a plurality of electrode terminals of the semiconductor device. The lead member includes an elastic body, and the lead member preferably includes connecting portions that press against and make contact with an electrode terminal of the semiconductor device and an electrode terminal of the circuit substrate by the elasticity of the elastic body.

In this case, the elasticity of the elastic body is utilized to ensure a reliable contact between the connecting portions of the lead member and the respective electrode terminals of the semiconductor device and the circuit substrate so that the reliability of the IC socket can be improved.

In the IC socket according to the above aspect, the elastic body may be a spring.

In this case, an inexpensive spring that can be obtained relatively easily may be used as the elastic body so that the manufacturing cost of the IC socket can be reduced.

In the IC socket according to the above aspect, the elastic body may be formed from a conductor so that a signal may be transmitted via the elastic body from the electrode terminal of the semiconductor device to the electrode terminal of the circuit substrate.

In this case, the elastic body is utilized as a conduction line for transmitting the signal so that the structure of the lead member can be simplified.

In the IC socket according to the above aspect, the lead member may include a conductor, and the elastic body may be formed from an insulator. Thus in the lead member, a signal may be transmitted from the electrode terminal of the semiconductor device to the electrode terminal of the circuit substrate via the conductor.

In this case, a variety of materials may be utilized as the elastic body such as a resin which is an insulator so that the degree of freedom in designing the lead member can be improved.

The semiconductor device according to another aspect of the present invention is provided with the IC socket according to the above aspect.

In this manner, the IC socket can be repaired with ease when a defect is found in a lead member in the IC socket of the semiconductor device so that the repair of such a defect can be effected speedily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
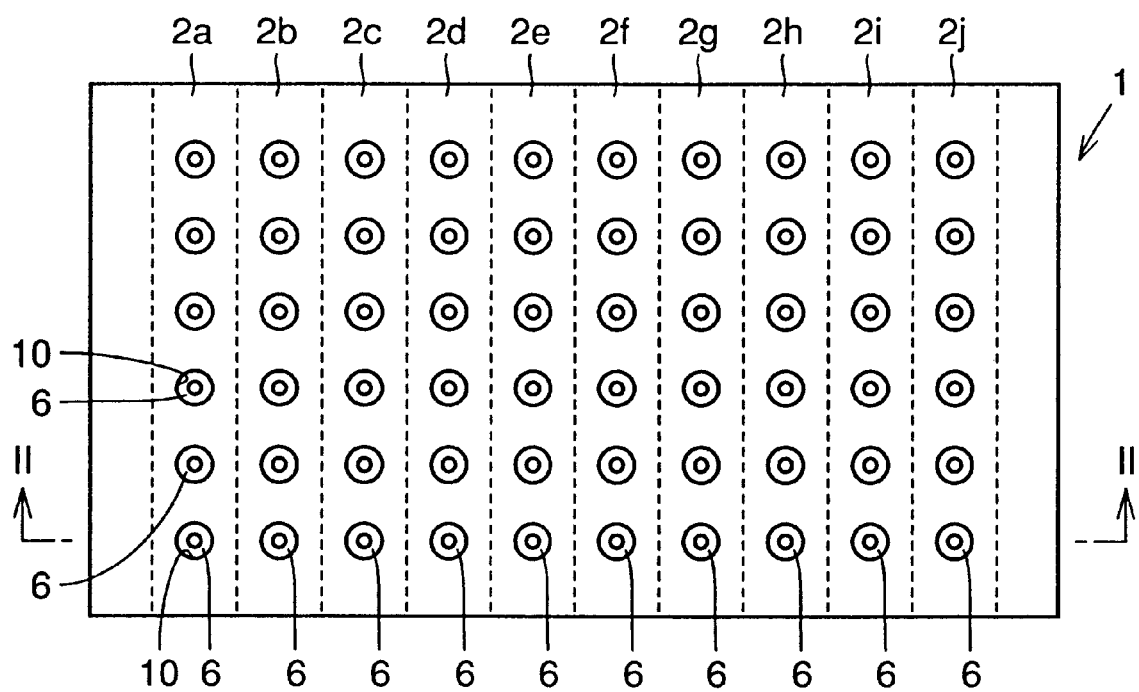
FIG. 1 is a schematic plan view representing a first embodiment of the IC socket according to the present invention.

The embodiments of the present invention will be described below with reference to the drawings. Throughout the drawings, the same or corresponding parts are denoted by the same reference characters, and the descriptions thereof will not be repeated.

First Embodiment

The IC socket will be described in relation to FIGS. 1 and 2. FIG. 2 schematically shows a cross section of an IC socket 1 taken along the line II—II in FIG. 1.

Figure 2:
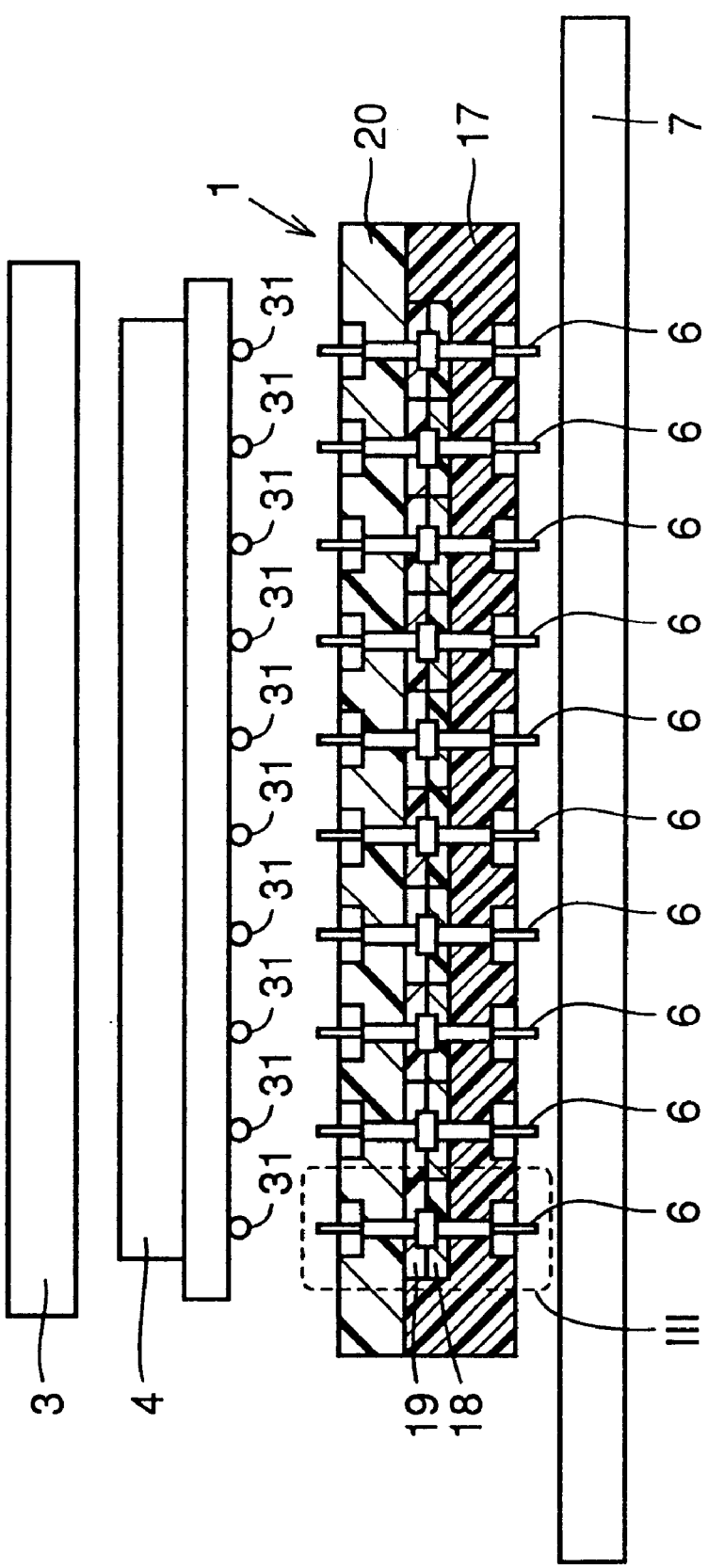
FIG. 2 is a schematic diagram illustrating a semiconductor device formed by disposing the IC socket shown in FIG. 1 on a circuit substrate.

As shown in FIGS. 1 and 2, in the semiconductor device according to the present invention, IC socket 1 is disposed on a circuit substrate 7. IC socket 1 is removably mounted on circuit substrate 7. A circuit to be connected to an IC device 4 via IC socket 1 is formed on circuit substrate 7. IC socket 1 connects a plurality of electrode terminals (not shown) of the circuit on circuit substrate 7 with electrodes 31 serving as a plurality of electrode terminals for IC device 4 which is the semiconductor device. IC device 4 is disposed on IC socket 1. A socket cover 3 for pressing down and fixing IC device 4 onto IC socket 1 is arranged on IC device 4. A plurality of electrodes 31 are disposed in a matrix on the bottom wall of IC device 4. Each electrode 31 is a hemispheric solder ball disposed on the bottom wall of IC device 4.

As shown in FIG. 1, in IC socket 1, leads 6 serving as a plurality of lead members are disposed in a matrix in positions corresponding to a plurality of electrodes 31 of IC device 4. A plurality of openings 10 are formed on an upper surface of IC socket 1, and upper terminals 8 (see FIG. 3) of leads 6 project from these openings 10.

Figure 3:
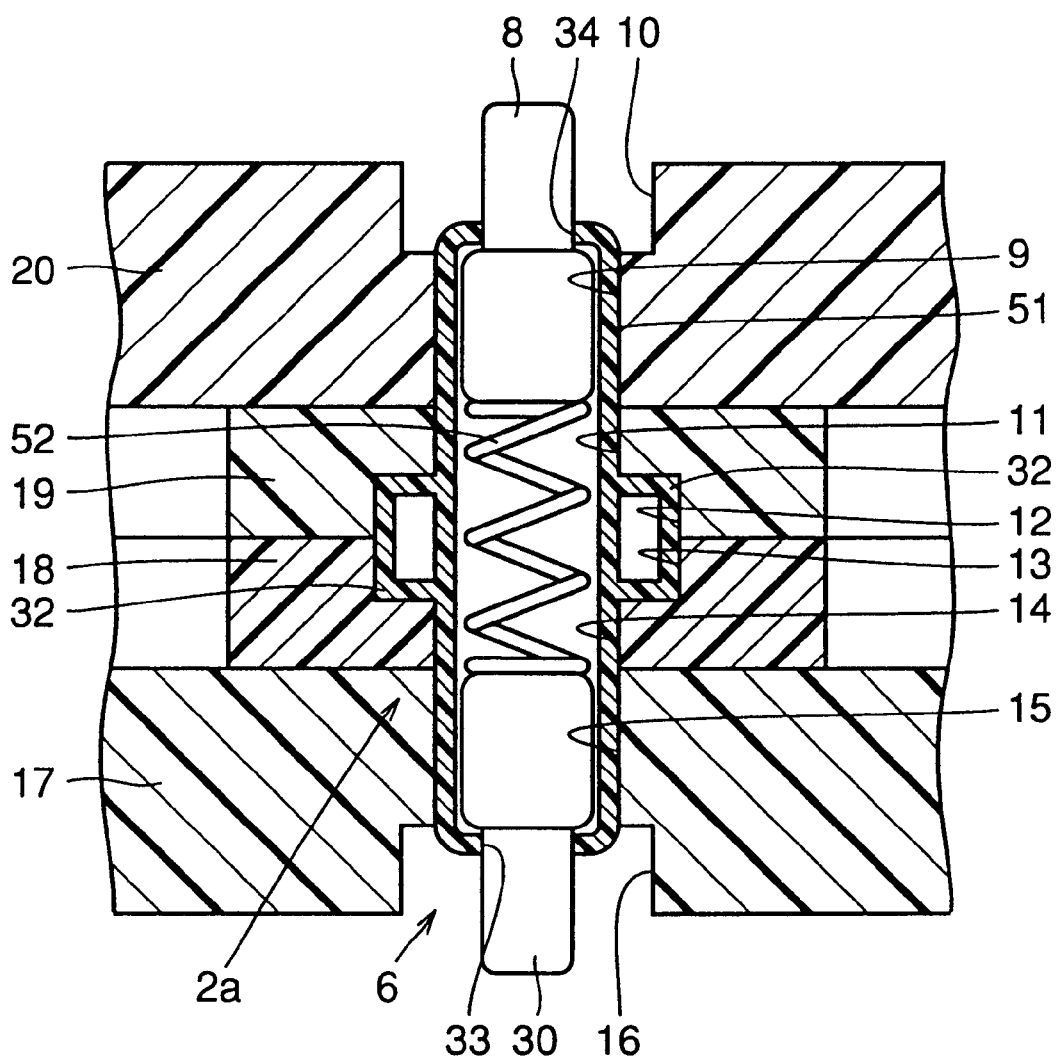
FIG. 3 is an enlarged schematic cross sectional view of a region III in FIG. 2.
Figure 13:
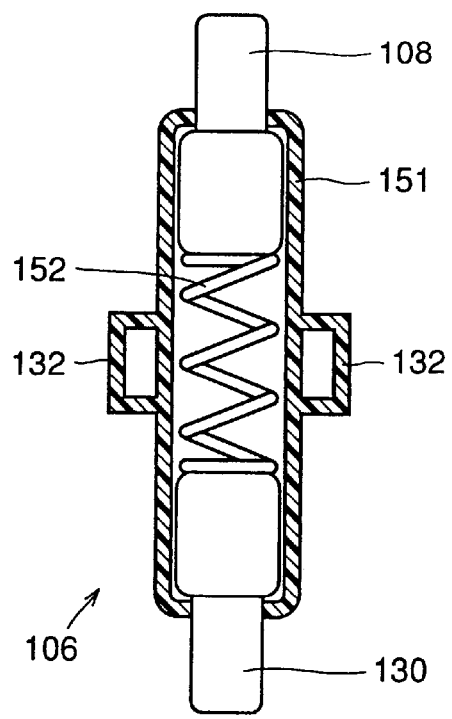
FIG. 13 is a schematic diagram representing the structure of a lead.
Figure 14:
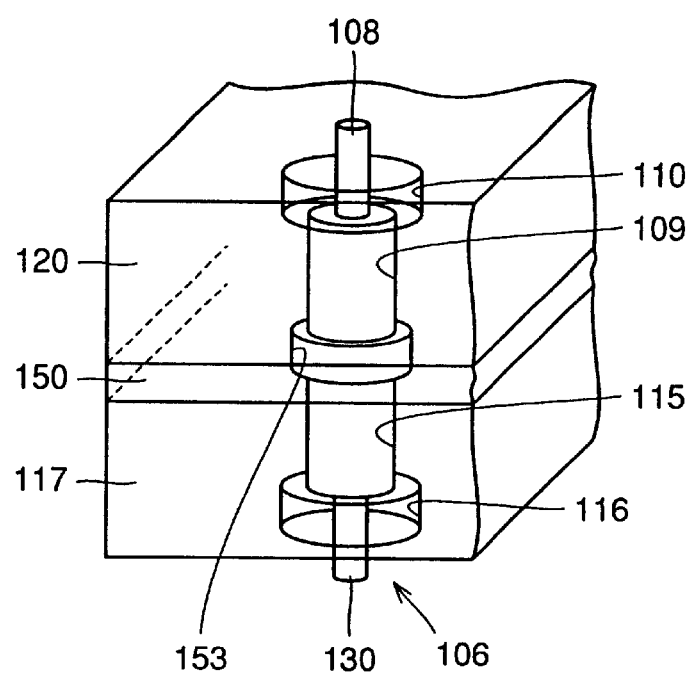
FIG. 14 is a schematic perspective view of the IC socket shown in FIG. 11.
Figure 15:
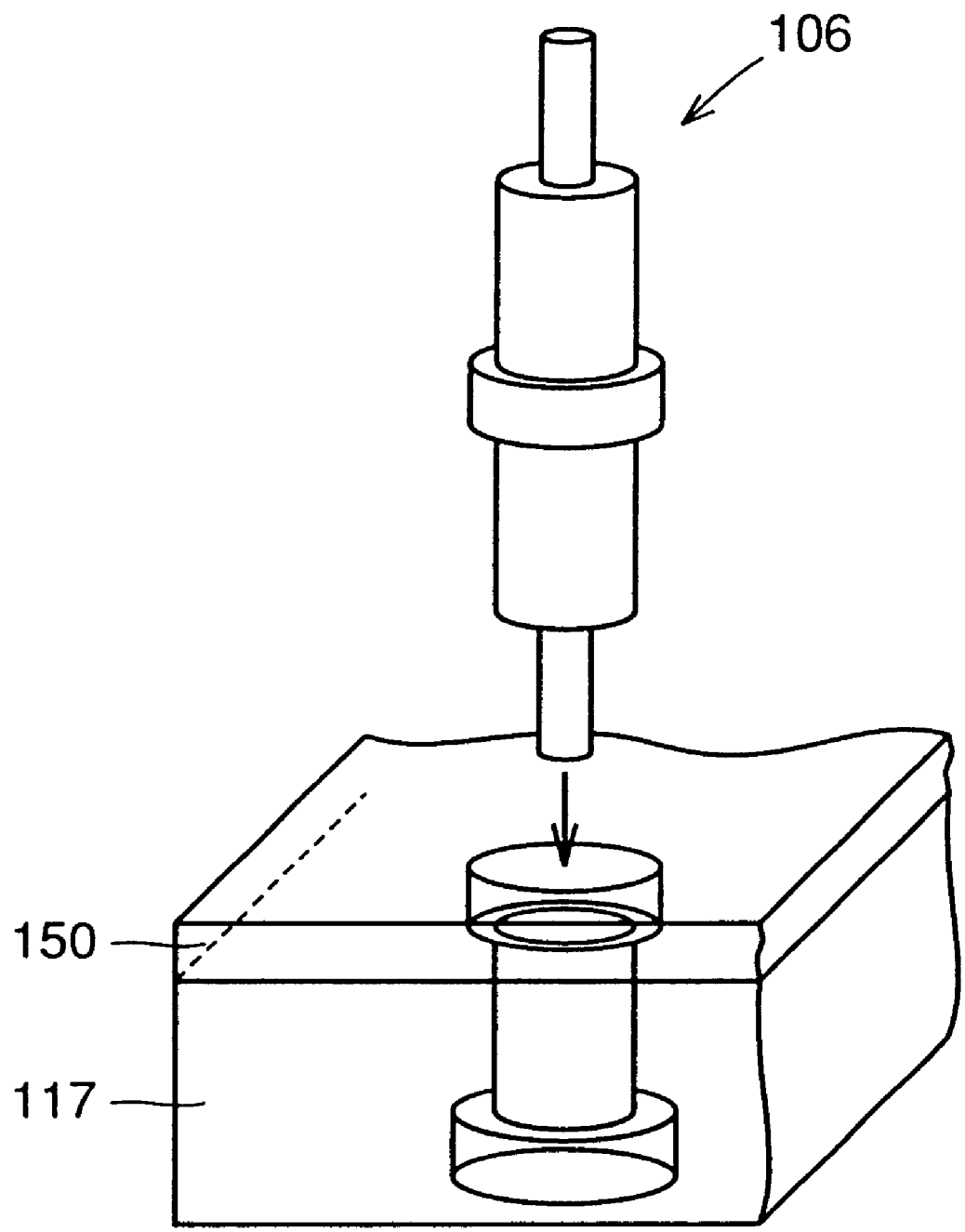
FIG. 15 is a schematic perspective view related to the description of the lead replacement process in the IC socket shown in FIG. 11.

A lead 6 has a linear shape, and its structure is the same as that of lead 106 shown in FIG. 13. In other words, as shown in FIG. 3, lead 6 includes a lead cylindrical body 51, an upper terminal 8 serving as a contact portion, a lower terminal 30 serving as a contact portion, and a spring 52 which is an elastic body. Lead cylindrical body 51 has a hollow cylindrical shape, and openings 33 and 34 are respectively formed on an upper surface and a bottom surface of lead cylindrical body 51. Upper terminal 8, lower terminal 30, and spring 52 are accommodated within lead cylindrical body 51. A portion of upper terminal 8 projects from opening 34 in the upper surface of lead cylindrical body 51. A portion of lower terminal 30 projects from opening 33 in the lower surface of lead cylindrical body 51. The diameter of the portion of upper terminal 8 residing within lead cylindrical body 51 is larger than the diameter of opening 34 formed in the upper surface of lead cylindrical body 51, and the diameter of the portion of lower terminal 30 residing within lead cylindrical body 51 is larger than the diameter of opening 33 formed in the lower surface of lead cylindrical body 51. As a result, neither upper terminal 8 nor lower terminal 30 is pushed out from lead cylindrical body 51. Spring 52 is provided between upper terminal 8 and lower terminal 30.

The description as to how IC socket is used will be given in relation to FIG. 2. IC socket 1 is arranged on circuit substrate 7. IC device 4 is disposed on IC socket 1. By pressing down IC device 4 with IC socket cover 3, IC device 4 is pressed against the upper surface of IC socket 1. At the same time, electrode 31 is pressed against upper terminal 8 of lead 6. Thus, the reliable contact between upper terminal 8 and electrode 31 serving as an electrode terminal of IC device 4 can be ensured by the elasticity of spring 52. Similarly, when IC socket 1 is pressed against circuit substrate 7, the reliable contact between lower terminal 30 and an electrode serving as an electrode terminal of the circuit on circuit substrate 7 can be ensured by the elasticity of spring 52. Thus, the reliability of IC socket 1 can be improved.

In addition, an inexpensive spring 52 that can be obtained is relatively easily may be used as the elastic body in lead 6 so as to reduce the manufacturing cost of IC socket 1.

Moreover, in IC socket 1, spring 52 which is the elastic body can be formed from a conductor, and a signal may be transmitted via spring 52 from electrode 31 of IC device 4 to the electrode on circuit substrate 7. In this case, the structure of lead 6 can be simplified since spring 52 is utilized as a conduction line for transmitting the signal.

Moreover, in lead 6, spring 52 can be formed from an insulator. In this case, lead 6 may include another conductor acting as the conduction line. In such a case, in lead 6, a signal may be transmitted via this conductor from electrode 31 of IC device 4 to the electrode on circuit substrate 7. For instance, lead cylindrical body 51 formed of a conductor may be utilized as the above-mentioned conductor. In this case, a variety of materials such as a resin which is an insulator may be utilized as a material for spring 52 serving as the elastic body so that the degree of freedom in designing lead 6 can be improved. Furthermore, not only spring 52 but also an elastic body having a different shape such as a rectangular rubber-like material may be utilized as the elastic body in lead 6 as long as it can provide the force of repulsion to upper terminal 8 and lower terminal 30.

As shown in FIGS. 1 and 3, as described above, IC socket 1 removably mounted on circuit substrate 7 includes leads 6 serving as a plurality of linear lead members, modules 2a to 2j serving as lead modules, a socket base body 17, and a socket cover body 20. Replaceable modules 2a to 2j each hold leads 6 of each group of a plurality of groups into which a plurality of leads 6 are divided, and are correspondingly provided to the plurality of groups. The plurality of leads 6 are arranged in a straight line in modules 2a to 2j. Socket base body 17 is provided between circuit substrate 7 and modules 2a to 2j, and determines the positions of modules 2a to 2j on circuit substrate 7. Socket cover body 20 is arranged such that it makes contact with modules 2a to 2j.

Thus, when a defect is found in a lead 6, the defective lead 6 can be replaced with a normal lead by replacing a module from modules 2a to 2j that includes the defective lead 6. In this manner, IC socket 1 can be easily repaired. Consequently, the high efficiency of the repair process of IC socket 1 can be maintained even when IC device 4 is miniaturized so that the size of lead 6 and the distance between leads 6 become smaller.

When leads 6 are removable in modules 2a to 2j, the process of removing/mounting a lead 6 from/to modules 2a to 2j can be easily performed since a linear lead 6 is used instead of the lead having a curved portion.

In addition, since modules 2a to 2j are arranged on socket base body 17 which resides on circuit substrate 7, the replacement of a module from modules 2a to 2j including a lead 6 having a defect can be performed with socket base body 17 being disposed on circuit substrate 7. Thus, the positional relationship between circuit substrate 7 and a lead 6 included in a module other than the module from modules 2a to 2j that includes a defective lead 6 can be kept from disadvantageously changing due to the replacement process.

Moreover, since socket cover body 20 is disposed making contact with modules 2a to 2j, modules 2a to 2j can be fixed in position by socket cover body 20.

Modules 2a to 2j all have the same structure. As an example, the structure of module 2a will now be described. As shown in FIGS. 1 and 3, module 2a includes a module base body 18, module cover body 19, and a plurality of leads 6. Module base body 18 has openings 14 and 13 formed in a region where lead 6 is to be held. The diameter of opening 14 is substantially the same as the diameter of a lead cylindrical body 51 of lead 6. Moreover, the diameter of opening 13 is substantially the same as the diameter of a lead protrusion 32 of lead 6. By inserting the lower portion of lead 6 into openings 13 and 14 of module base body 18, lead 6 can be held and be positioned in module 2a. Moreover, openings 12 and 11 are formed in module cover body 19. The diameter of opening 11 is substantially the same as the diameter of lead cylindrical body 51 of lead 6. The diameter of opening 12 is substantially the same as the diameter of lead protrusion 32 of lead 6. Then, module cover body 19 is placed and fixed onto module base body 18 with a lead 6 inserted therein such that lead 6 is inserted into openings 11 and 12 so that lead 6 can be fixed. Module 2a is thus formed.

Thus, module 2a in which lead 6 is fixed in a precise position by module base body 18 and a module cover body 19 can be obtained.

In addition, module base body 18 and module cover body 19 are removably fixed by a module cover fixing member such as a screw so that only the lead 6 having the defect can be removed from module 2a and be replaced with a new lead 6. As a result, module 2a can be reused. Moreover, when module cover body 19 is removed with module 2a being mounted on socket base body 17, lead 6 having the defect alone can be replaced as in the conventional example.

Socket base body 17 has openings 15 and 16 formed as through-holes that pass through from an upper surface to a lower surface of socket base body 17. The diameter of opening 15 formed in the upper surface side of socket base body 17 is substantially the same as the diameter of lead cylindrical body 51 of lead 6. The diameter of opening 16 formed in the lower surface side of socket base body 17 is larger than the diameter of opening 15. These openings 15 and 16 are formed in a position in which lead 6 is to be arranged in IC socket 1.

Socket cover body 20 has openings 9 and 10 formed as upper through-holes pass through from its upper surface to its lower surface. The diameter of opening 9 in the lower surface side of socket cover body 20 is substantially the same as the diameter of lead cylindrical body 51 of lead 6. The diameter of opening 10 formed in the upper surface side of socket cover body 20 is larger than the diameter of opening 9. These openings 9 and 10 are formed in a position in which lead 6 is to be arranged in IC socket 1.

Figure 4:
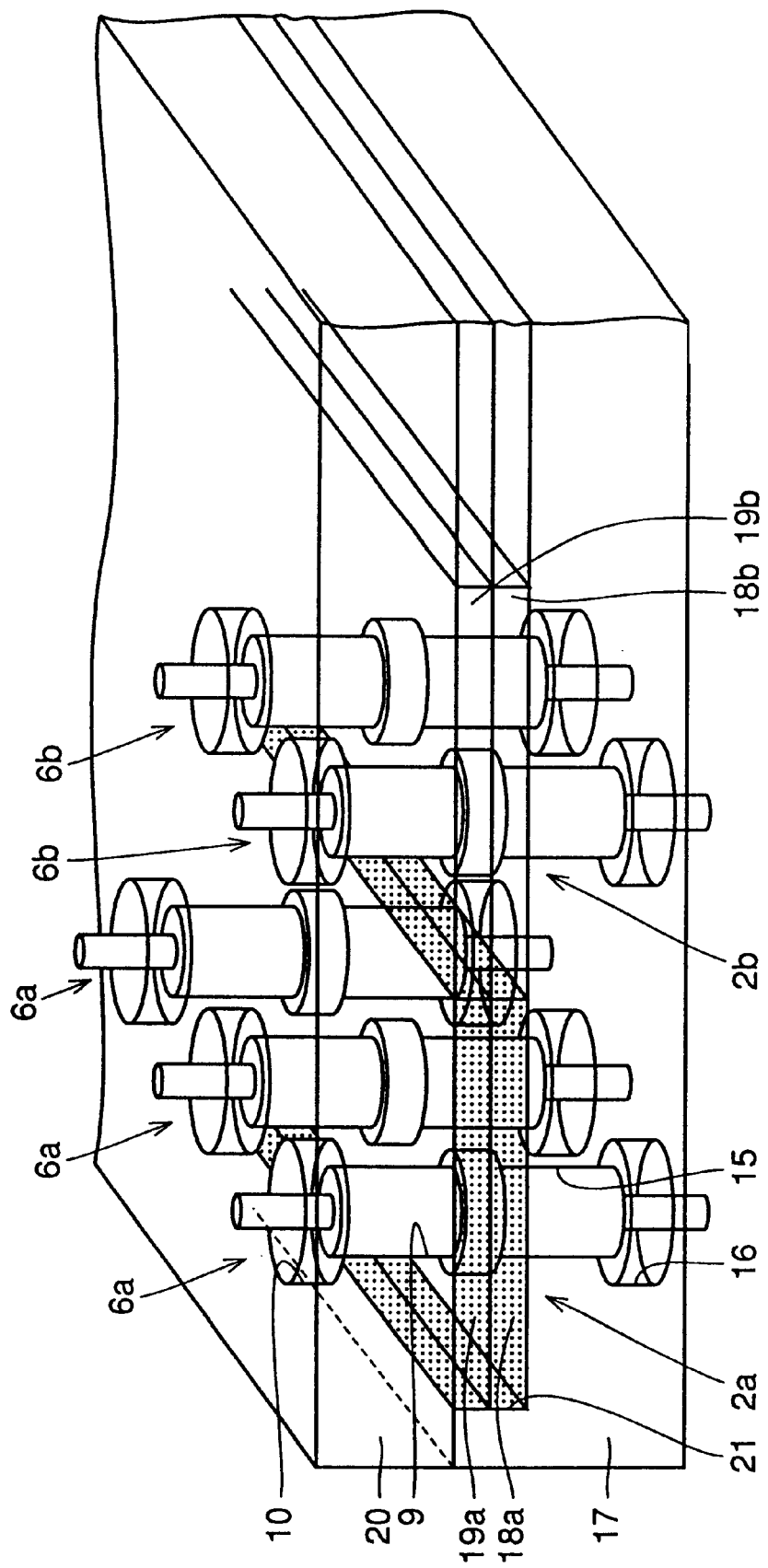
FIG. 4 is a schematic perspective view of the IC socket shown in FIG. 1.

As shown in FIG. 4, a trench 21 into which modules 2a to 2j are pressed is formed in socket base body 17. Modules 2a to 2j are pressed into trench 21. In FIG. 4, modules 2a and 2b are shown by way of example. Module 2a includes a module base body 18a, leads 6a, and a module cover body 19a. Module 2b includes a module base body 18b, leads 6b, and a module cover body 19b. A lower portion of a lead 6 of a module from modules 2a to 2j is inserted into openings 15 and 16 of socket base body 17 as shown in FIGS. 3 and 4. Then, socket cover body 20 is arranged and fixed onto socket base body 17 to which modules 2a to 2j are provided. Socket cover body 20 can thus fix modules 2a to 2j in place. At this time, an upper portion of a lead 6 of a module from modules 2a to 2j is inserted into openings 9 and 10 of socket cover body 20 as shown in FIGS. 3 and 4. A lower terminal 30 forming the lower terminal portion projects from the lower surface of socket base body 17 through opening 16 of socket base body 17. An upper terminal 8 forming the upper terminal portion projects from the upper surface of socket cover body 20 through opening 10 of socket cover body 20, as described above.

Now, the replacement process of module 2a in the case where a defect is found in lead 6a in IC socket 1 will be described in relation to FIG. 5.

Figure 5:
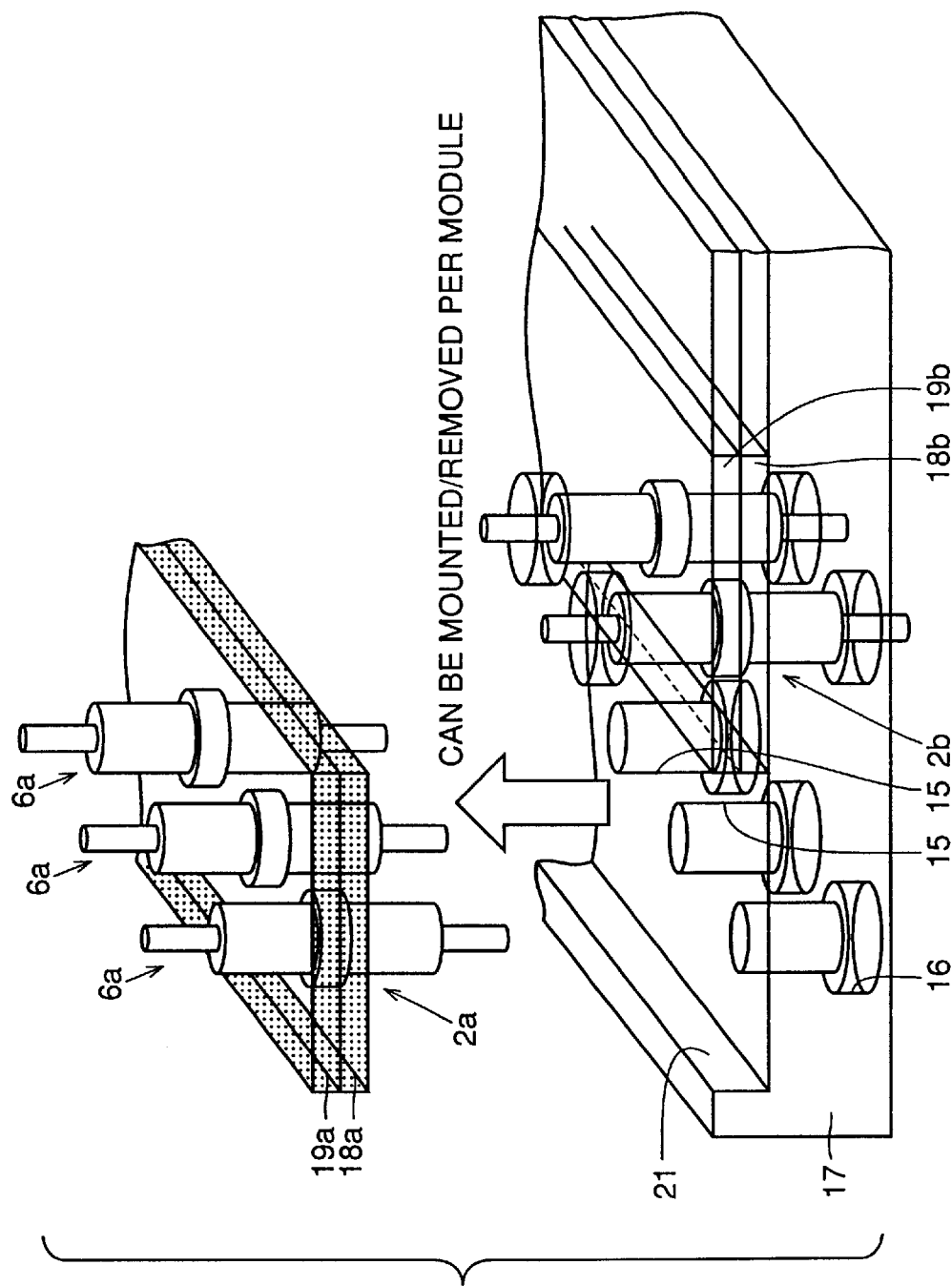
FIG. 5 is a schematic perspective view related to the description of the module replacement process in the IC socket shown in FIG. 1.

Referring to FIG. 5, first, socket cover body 20 is removed from IC socket 1. Then, module 2a including the defective lead 6a is removed from socket base body 17.

In this manner, when a defect is found in lead 6a as described above, the defective lead 6a can be replaced with a normal lead by replacing module 2a from modules 2a to 2j that includes the defective lead 6. In short, IC socket 1 can be repaired easily. Thus, the high efficiency of the repair process of IC socket 1 can be maintained even when IC device 4 is miniaturized and the size of leads 6a and 6b and the spacing between leads 6a and 6b become smaller.

Second Embodiment

Figure 6:
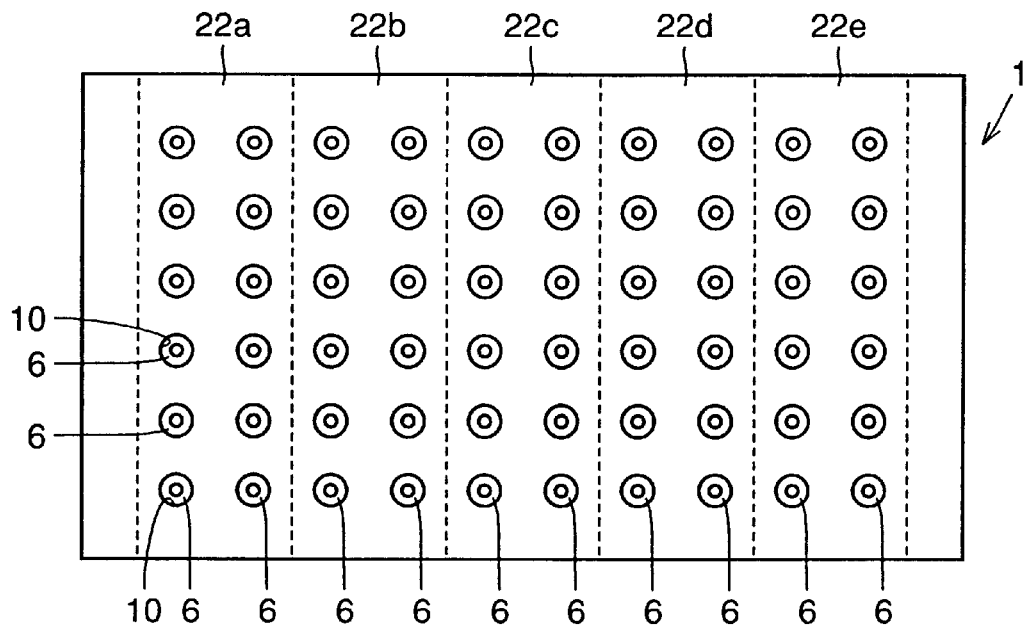
FIG. 6 is a schematic plan view representing a second embodiment of the IC socket according to the present invention.

In FIG. 6, IC socket 1 basically has the same structure as IC socket 1 shown in FIG. 1. In IC socket 1 shown in FIG. 6, however, each of modules 22a to 22e includes leads 6 disposed in a matrix of six rows and two columns.

Thus, larger modules 22a to 22e in which a plurality of modules 2a to 2j, each having leads 6 arranged in a straight line as shown in FIG. 1, are put together can be obtained. Consequently, the size of modules 22a to 22e can be kept large enough so that the efficiency of the replacement process does not decline when leads 6 are further miniaturized. As a result, the high efficiency of the replacement process of modules 22a to 22e can be maintained.

Third Embodiment

Figure 7:
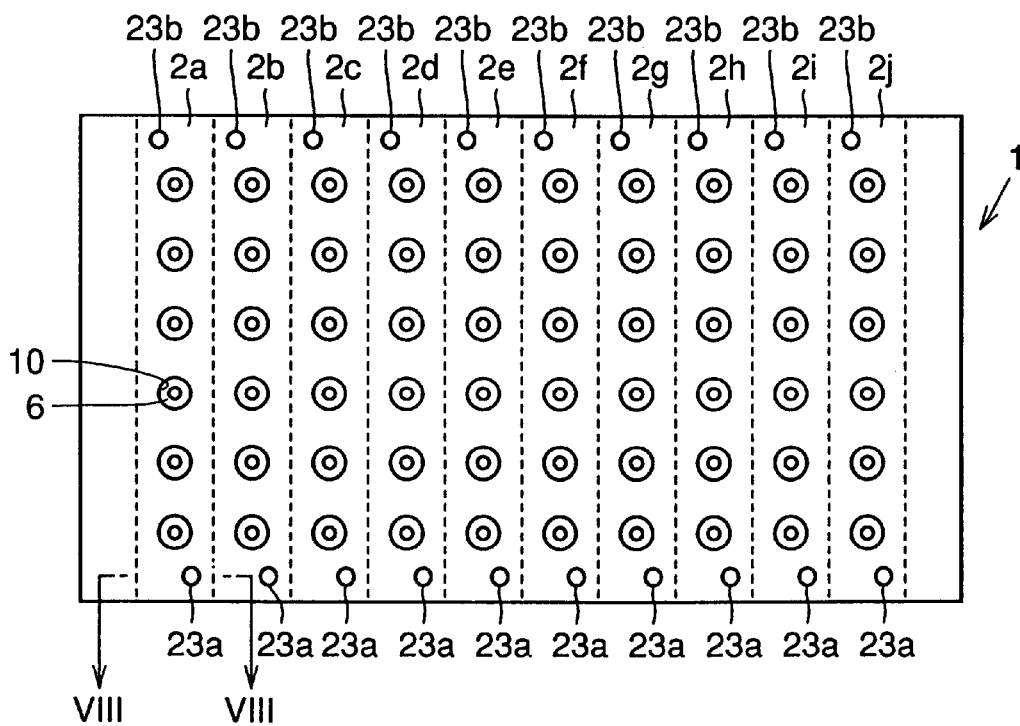
FIG. 7 is a schematic plan view representing a third embodiment of the IC socket according to the present invention.

As shown in FIG. 7, IC socket 1 basically has the same structure as IC socket 1 shown in FIG. 1. In IC socket 1 shown in FIG. 7, however, guide portions 23a and 23b are formed as guide members to socket base body 17, socket cover body 20, and each of modules 2a to 2j. Guide portions 23a and 23b basically have the same structure. As a representative example, the structure of guide portion 23a of module 2a will be described with reference to FIG. 8.

Figure 8:
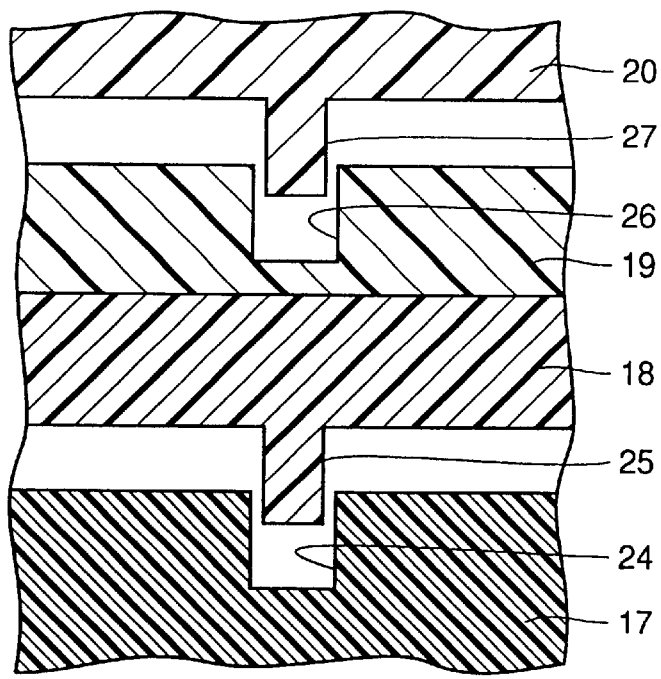
FIG. 8 is a schematic cross sectional view taken along the line VIII—VIII in FIG. 7.

As shown in FIG. 8, guide portion 23a consists of a dent 24 serving as a guiding dent formed in socket base body 17, a protrusion 25 serving as a guiding protrusion formed in module base body 18, a dent 26 formed in module cover body 19, and a protrusion 27 formed in socket cover body 20. Dent 24 is formed in a region in socket base body 17 underneath the region in which protrusion 25 of module 2a is located when module 2a is disposed on socket base body 17. Dent 26 is formed in a region in module cover body 19 underneath the region in which protrusion 27 is located when socket cover body 20 is disposed on module cover body 19. Moreover, in IC socket 1, protrusion 25 of module base body 18 is inserted into dent 24 of socket base body 17. Protrusion 27 of socket cover body 20 is inserted into dent 26 of module cover body 19. Thus, by inserting protrusion 25 of module 2a into dent 24 of socket base body 17, the position of module 2a relative to socket base body 17 can be easily determined. Similarly, for other modules 2b to 2j, guide portions 23a and 23b can be used easily to determine their positions relative to socket base body 17. As a result, the efficiency of the replacement process of modules 2a to 2j can be further improved.

Moreover, protrusion 25 and dent 24 can be utilized as fixing members for fixing module 2a to socket base body 17, thereby the strength with which module 2a is fixed to socket base body 17 can be improved. Furthermore, in other modules 2b to 2j, the same effect can be achieved by utilizing guide portions 23a and 23b as fixing members for socket base body 17 in the same manner.

In addition, protrusion 27 and dent 26 can be utilized as fixing members for fixing module 2a to socket cover body 20. Further, in other modules 2b to 2j, guide portions 23a and 23b can be utilized as fixing members for fixing modules 2b to 2j to socket cover body 20 in the same manner.

Fourth Embodiment

Figure 9:
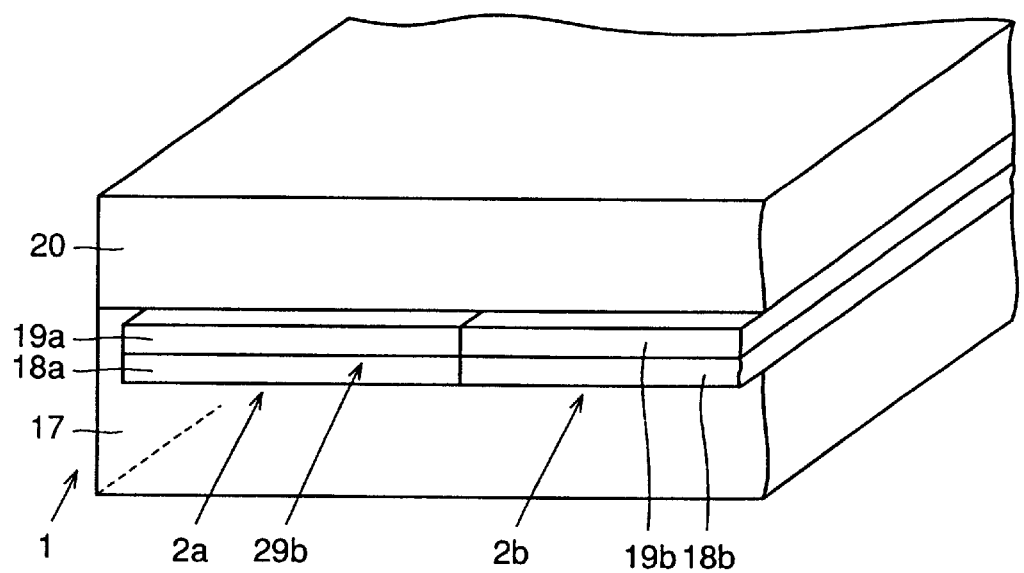
FIG. 9 is a schematic perspective view illustrating a fourth embodiment of the IC socket according to the present invention.
Figure 10:
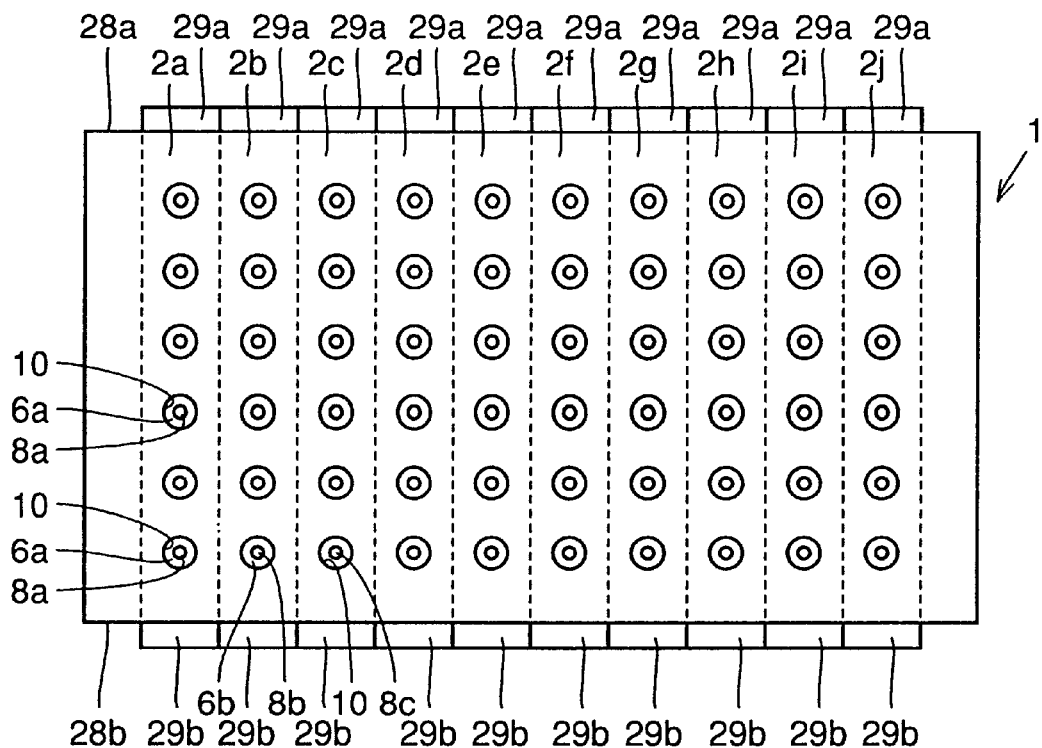
FIG. 10 is a schematic plan view of the IC socket shown in FIG. 9.
Figure 11:
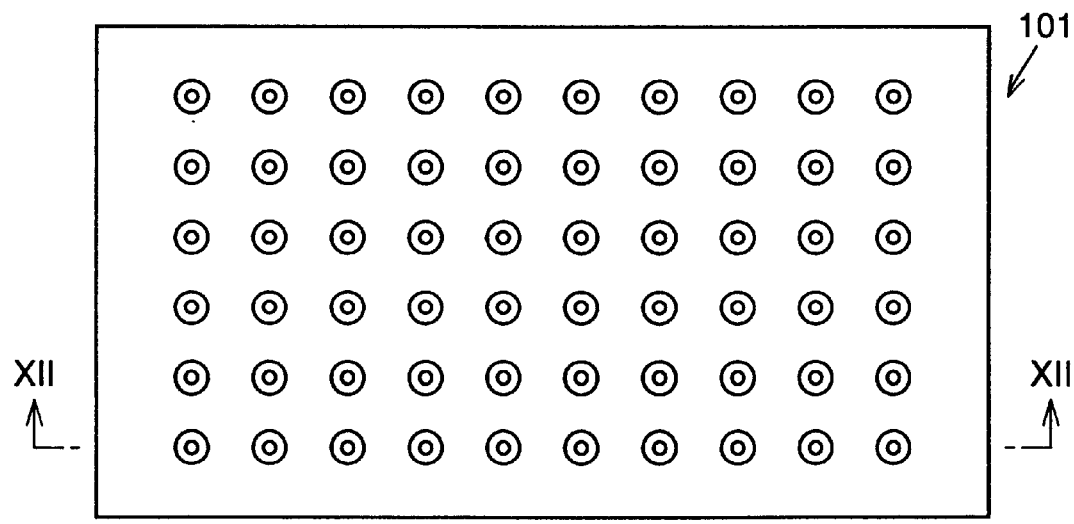
FIG. 11 is a schematic plan view showing a conventional IC socket.
Figure 12:
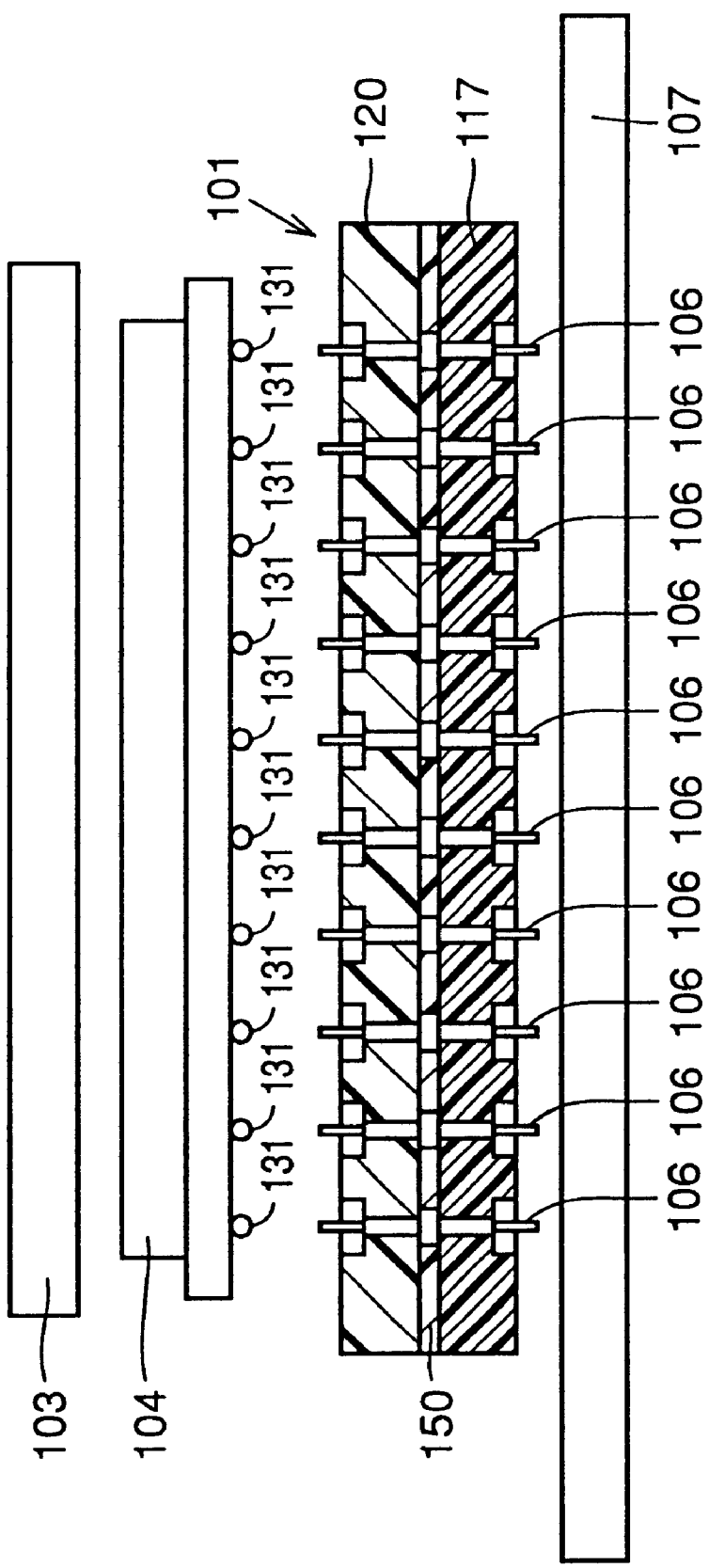
FIG. 12 is a schematic diagram representing a semiconductor device formed by disposing the IC socket shown in FIG. 11 on a circuit substrate.

In FIGS. 9 and 10, IC socket 1 basically has the same structure as IC socket 1 shown in FIG. 1. The ends of modules 2a to 2j, however, form projections 29a and 29b which project from sidewalls 28a and 28b of socket base body 17.

In this way, when replacing modules 2a to 2j, an operator can hold these projections 29a and 29b to remove modules 2a to 2j from socket base body 17 with ease. Thus, the efficiency of the replacement process of modules 2a to 2j can be further improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An IC socket removably mounted on a circuit substrate, comprising:
   a plurality of linear lead members;
   a lead module being replaceable and for holding said lead members of each group of a plurality of groups into which the plurality of lead members are divided, wherein the lead module is provided in plurality to hold each of the plurality of groups, said IC socket including a socket base body placed between the circuit substrate and said lead module for positioning said lead module against said circuit substrate;
   a guiding protrusion on a surface of said lead module facing said socket base body; and
   a guiding dent on a surface of said socket base body facing said lead module for inserting said protrusion, said guiding dent being positioned underneath a region in which said guiding protrusion of said lead module is located when said lead module is arranged on said socket base body.

2. The IC socket according to claim 1, wherein
   said plurality of lead members are arranged in a matrix in said lead module.

3. The IC socket according to claim 1; wherein
   said socket base body has a sidewall, and
   said lead module includes a projection that projects outward past the sidewall of said socket base body.

4. The IC socket according to claim 1, wherein
   said lead module includes
   a module base body for holding said lead members and determining positions of said lead members in said lead module, and
   a module cover body disposed on said module base body for fixing said lead members.

5. The IC socket according to claim 1, further comprising:
   a socket cover body arranged on said lead module and making contact with said lead module.

6. The IC socket according to claim 1 for respectively connecting a plurality of electrode terminals on said circuit substrate to a plurality of electrode terminals of a semiconductor device, wherein
   each of said lead members includes an elastic body, and a connecting portion that is pressed against and makes contact with each of the electrode terminals of said semiconductor device and the electrode terminals on said circuit substrate using elasticity of said elastic body.

7. A semiconductor device provided with the IC socket according to claim 1.

8. The IC socket according to claim 4, further comprising:
   a socket cover body arranged on said lead module and making contact with said lead module.

9. The IC socket according to claim 8, wherein
   said socket cover body has an upper surface and a lower surface, and said socket cover body has an upper through-hole formed that passes through from the upper surface to the lower surface of said socket cover body for inserting a portion of each of said lead members,
   said socket base body has an upper surface and a lower surface, and said socket base body has a through-hole formed that passes through from the upper surface to the lower surface of said socket base body for inserting another portion of each of said lead members,
   said module cover body has a hole formed that is located underneath the upper through-hole of said socket cover body and into which each of said lead members is inserted, and
   each of said lead members includes a lower terminal portion that projects from the lower surface of said socket base body via the through-hole of said socket base body and an upper terminal portion that projects from the upper surface of said socket cover body via the upper through-hole of said socket cover body.

10. The IC socket according to claim 6, wherein said elastic body is a spring.

* * * * *